United States Patent [19]

Yamazaki

[11] Patent Number: 4,623,369

[45] Date of Patent: Nov. 18, 1986

[54] REFINING PROCESS OF REACTIVE GAS FOR FORMING SEMICONDUCTOR LAYER

[75] Inventor: Shunpei Yamazaki, Tokyo, Japan

[73] Assignee: Semiconductor Energy Laboratory Co., Ltd., Tokyo, Japan

[21] Appl. No.: 750,512

[22] Filed: Jul. 1, 1985

Related U.S. Application Data

[62] Division of Ser. No. 499,271, May 31, 1983, Pat. No. 4,549,889.

[30] Foreign Application Priority Data

May 31, 1982 [JP] Japan .................................. 57-92611

[51] Int. Cl.⁴ .............................................. F25J 3/00
[52] U.S. Cl. .................................. 62/11; 156/DIG. 89
[58] Field of Search ................ 156/DIG. 89; 62/9, 11

[56] References Cited

FOREIGN PATENT DOCUMENTS 19181 2/1978 Japan .......................... 156/DIG. 89
34158 3/1980 Japan .......................... 156/DIG. 89

Primary Examiner—Frank Sever
Attorney, Agent, or Firm—Gerald J. Ferguson, Jr.; Michael P. Hoffman; Bonni S. Malamud

[57] ABSTRACT

A refined reactive gas is obtained by repeating more than once a step of liquefying a reactive gas and gasifying the liquefied gas in a liquefying and gasifying receptacle. Prior to the liquefaction-gasification step, cleaning treatment of the liquefying and gasifying receptacle thereinto hydrogen and then evacuating the receptacle.

12 Claims, 2 Drawing Figures

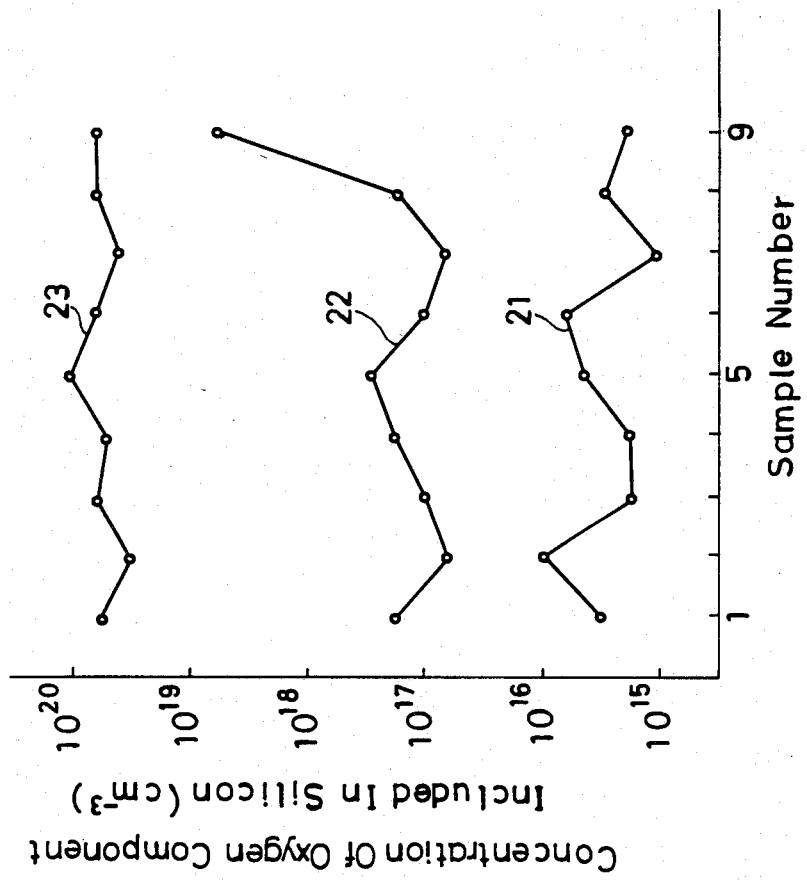

REFINING PROCESS OF REACTIVE GAS FOR FORMING SEMICONDUCTOR LAYER

This is a divisional application of Ser. No. 499,271, filed May 31, 1983, now U.S. Pat. No. 4,549,889.

BACKGROUND OF THE INVENTION

1. Field of the Invention

In the case of forming a semiconductor layer on a substrate through the use of what is called the CVD (Chemical Vapor Deposition) method including vapor phase epitaxy, or plasma CVD method using electric or photo energy, reactive gases, such as a reactive semiconductor material gas which is the raw material of a semiconductor forming the semiconductor layer and a reactive impurity material gas which is the raw material of an impurity imparting a conductivity type to the semiconductor layer.

The present invention relates to a method of purifying reactive gases which are employed for the fabrication of a semiconductor layer through the CVD method.

2. Description of the Prior Art

The reactive gas for use in the formation of a semiconductor layer on a substrate by the CVD method is widely on sale.

The reactive gas now placed on the market is usually loaded into a container made of iron or what is called a Bombe.

The reactive gas before being loaded into the Bombe has as high a purity as 6 nines (99.9999) to 7 nines (99.99999) and contains unwanted impurities no more than 1 ppm.

However, the reactive gas commercially available at present usually contains unnecessary impurities, such as oxygen, carbon, silicon oxide, hydrocarbon, heavy metal and so forth, in as large quantities as 0.01 to 0.1% on the ground that when the reactive gas is packed into the Bombe, the surrounding gas (usually air) enters into the Bombe.

With such a reactive gas containing large quantities of undesirable impurities, it is impossible to form a semiconductor layer with required electric and photoelectric characteristics.

For example, in the case of forming a non-single-crystal semiconductor layer through using a reactive semiconductor material gas, if the reactive gas contains oxygen, the resulting non-single-crystal semiconductor layer would contain oxygen clusters which act as recombination centers. And, in this case, if the non-single-crystal semiconductor layer has dangling bonds, then it would contain oxygen which acts as a doner center making the layer N type. Furthermore, if the reactive semiconductor material gas contains oxygen, then the semiconductor forming the non-single-crystal semiconductor layer would be coupled with the oxygen to form a semiconductor oxide which acts as a barrier against electrons or holes or as an insulator.

As described above, in the case of forming the non-single-crystal semiconductor layer throught using the reactive semiconductor material gas, if the reactive gas contains oxygen, then required electric and photoelectric characteristics of the semiconductor layer cannot be obtained.

Furthermore, for instance, in the case of forming a non-single-crystal semiconductor layer containing microcrystals and having regularity of such a short range order between 5 to 200 Å through using the reactive semiconductor material gas, if the reactive gas contains oxygen, then it would be impossible to form such a non-single-crystal semiconductor layer desired to obtain. In consequence, the non-single-crystal semiconductor layer cannot be formed with required electric and photoelectric characteristics.

SUMMARY OF THE INVENTION

It is therefore a primary object of the present invention to provide a novel refining process of a reactive gas for use in the formation of a semiconductor layer through the CVD method by which even a reactive gas containing large quantities of undesirable impurities, such as the aforementioned commercially available gas, can be purified to obtain a reactive gas free from the abovesaid defects.

According to the reactive gas refining process of the present invention, a refined reactive gas is obtained by repeating more than once a step of liquefying a reactive gas and then gasifying the liquefied reactive gas to obtain a reactive gas again.

According to the reactive gas refining process of the present invention, even if the starting reactive gas contains a large amount of an impurity, the refined reactive gas hardly contains it, or if contains, its amount is markedly smaller than in the starting reactive gas. That is to say, the refined reactive gas contains the unnecessary impurity no more than 1 ppm, for example, 1 to 100 ppb. In particular, the oxygen concentration is as low as $1 \times 10^{17}$ cm$^{-3}$.

Accordingly, in the case of forming a semiconductor layer by the CVD method on a substrate through using the refined reactive gas obtained with the refining process of the present invention, the semiconductor layer can be formed to have required electric and photoelectric characteristics.

Other objects, features and advantages of the present invention will become more fully apparent from the detailed description taken in conjuction with the accompanying drawings.

BRIEF DESCRIPTION OF THE DRAWINGS

FIG. 2 a graph showing the concentration (cm$^{-3}$) of oxygen contained in a semiconductor layer formed by the CVD method through using a reactive gas refined by the reactive gas refining process of the present invention in comparison with the concentration of oxygen contained in a semiconductor layer similarly formed through using a commercially available reactive gas.

DESCRIPTION OF THE PREFERRED EMBODIMENTS

Figure 1:
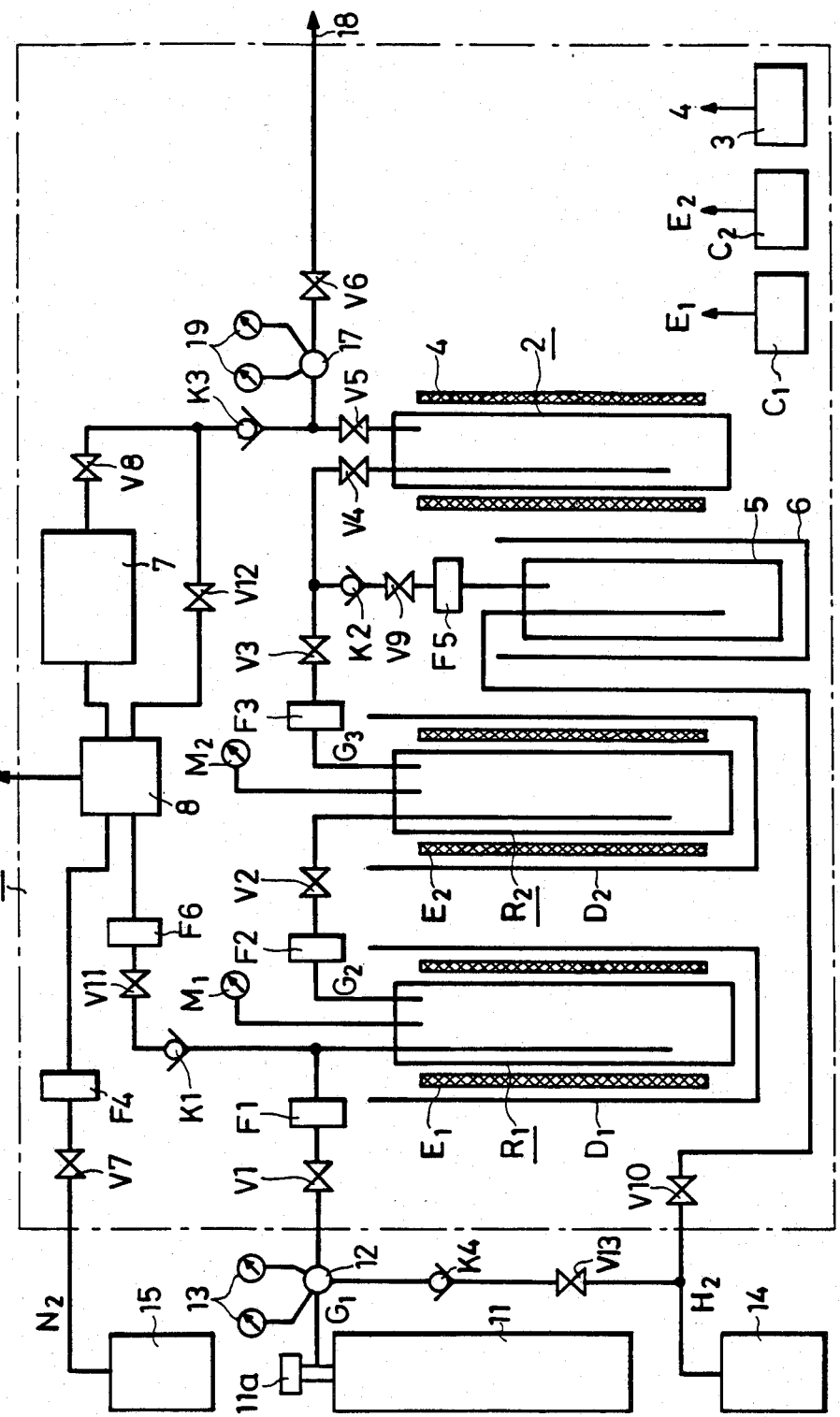
FIG. 1 is a diagram schematically illustrating an embodiment of the reactive gas refining process of the present invention and an embodiment of reactive gas refinery equipment therefor.

In FIG. 1 reference numeral 1 indicates generally reactive gas refinery equipment for use with an embodiment of the reactive gas refining process of the present invention.

The reactive gas refinery equipment 1 is provided with first to nth (n being an integer larger than 1) liquefying and gasifying receptacles $R_1$ to $R_n$. FIG. 1 shows the case of n=2 and, accordingly, two liquefying and gasifying receptacles $R_1$ and $R_2$ (=$R_n$) are shown. Disposed around the liquefying and gasifying receptacles $R_1$ and $R_2$ are heaters $E_1$ and $E_2$ which are controlled by controllers $C_1$ and $C_2$, respectively. The liquefying and gasifying receptacles $R_1$ and $R_2$ are disposed in DEWAR'S vessel $D_1$ and $D_2$ together with the heaters $E_1$ and $E_2$.

The reactive gas refinery equipment 1 is further provided with a stroage container 2. The storage, container 2 is surrounded by a heater 4 which is controlled by a controller 3.

Furthermore, the reactive gas refinery equipment 1 is provided with a water removing container 5, which is also placed in a DEWAR'S vessel 6.

The reactive gas refinery equipment 1 is further provided with an exhaust system 7 including a turbo-pump and a mixer 8.

The liquefying and gasifying receptacle $R_1$ is coupled via a flowmeter F1 and a valve V1 with a check valve 12 which extends from a reactive gas cylinder 11 as a reactive gas source, the gas cylinder 11 being provided with a gas supply control cock 11a. The receptacle $R_1$ is further connected via a check valve k1, valve V11 and a flowmeter F6 to a first inlet of the mixer 8. The check valve 12, which extends from the gas cylinder 11, has attached therto compound (pressure) gauges 13. The receptacle $R_1$ has also attached thereto a compound (pressure) gauge $M_1$.

The liquefying and gasifying receptacles $R_1$ and $R_2$ are interconnected via a flowmeter F2 and a valve V2. The receptacle $R_2$ has also attached thereto a compound (pressure) gauge $M_2$. And the receptacle $R_2$ is coupled with the storage container 2 via a flowmeter F3 and valves V3 and V4.

The water removing receptacle 5 is coupled via a valve V10 to a hydrogen gas source 14 and connected to the connection point of the valves V3 and V4 via a flowmeter F5, a valve V9 and a check valve K2. The hydrogen gas source 14 is connected to the check valve 12 which extends from the reactive gas cylinder 11 via a valve V13 and a check valve K4.

Second inlet of the mixer 8 is connected to a nitrogen gas source 15 via a flowmeter F4 and a valve V7. The outlet of the mixer 8 is connected to an exhaust pipe 16 extending to the outside.

The storage container 2 is connected to a third inlet of the mixer 8 via a valve V5, a check valve K3 and a valve V12 and to the inlet of the exhaust system 7 via the valve V5, the check valve K3 and the valve V8. The outlet of the exhaust system 7 is connected to a fourth inlet of the mixer 8. Furthermore, the storage container 2 is connected via the valve V5, the check valve 17 and a valve V6 to a gas outlet pipe 18 extending to the outside. The check valve 17 has attached thereto a compound (pressure) gauge 19.

In the illustrated embodiment of the reactive gas refining process of the present invention, the reactive gas $G_1$ available from the reactive gas cylinder 11 is liquefied using the liquefying and gasifying receptacle $R_1$ to obtain a liquefied reactive gas $G_1'$, which is then gasified into a reactive gas $G_2$. Further, the reactive gas $G_2$ is liquefied using the liquefying and gasifying receptacle $R_2$ to obtain a liquefied gas $G_2'$, which is then gasified into the reactive gas $G_3$. The reactive gas $G_3$ thus obtained is stored in the storage container 2 and is afterwards employed for forming the aforementioned semiconductor layer through the CVD method.

According to this embodiment of the reactive gas refining process of the present invention, the reactive gas refinery equipment 1 is subjected to the following cleaning treatment prior to the abovesaid steps of liquefaction, gasification and storage of the reactive gas.

1. Cleaning Treatment of Reactive Gas Refinery Equipment (1a) It is made sure that the valves V1 to V13 of the reactive gas refinery equipment 1 are all closed.

(1b) Then it is made sure that the reactive gas cylinder 11 is coupled via the check valve 12 with the valve V1 which is coupled with the liquefying and gasifying receptacle $R_1$ via the flowmter F1. Further, it is made sure that the hydrogen gas source 14 is coupled with the valve V10 which is coupled with the water removing receptacle 5, and that a nitrogen gas source 15 is coupled with a valve V7 which is coupled with the mixer 8 via a flowmeter F4.

(1c) Next, the heaters $E_1$ and $E_2$ disposed around the liquefying and gasifying receptacles $R_1$ and $R_2$ and the heater 4 disposed around the storage container 2 are energized under the control of the controllers $C_1$, $C_2$ and 3, respectively, heating the receptacles $R_1$ and $R_2$ and the storage container 2 up to 200° to 300° C.

(1d) Next, the valbe V7 coupled with the nitrogen gas source 15 is opened to flow therefrom nitrogen gas ($N_2$) via a route (valve V7 - flowmeter F4-mixer 8-exhaust pipe 16), cleaning the route with the nitrogen gas.

(1e) Next, the exhaust system 7 is activated after closing the valve V7. This is followed by opening of the valve V1 in the route between the reactive gas cylinder 11 and the liquefying and gasifying receptacle $R_1$, the valve V2 in the route between the liquefying and gasifying receptacles $R_1$ and $R_2$, the valves V3 and V4 in the route between the liquefying and gasifying receptacle $R_2$ and the storage container 2, the valve V9 in the route between the connection point of the valves V3 and V4 and the water removing receptacle 5, and the valves V5 and V8 in the route between the storage container 2 and the exhaust system 7. The liquefying and gasifying receptacles $R_1$ and $R_2$ and the storage container 2, including the routes between the reactive gas cylinder 11 and the liquefying and gasifying receptacle $R_1$, between the valve V13 coupled with the hydrogen gas source 14 and the check valve 12 coupled with the gas cylinder 11, between the liquefying and gasifying receptacles $R_1$ and $R_2$, between the liquefying and gasifying receptacle $R_2$ and the storage container 2, between the liquefying and gasifying receptacle $R_2$ and the water removing receptacle 5, between the valve V10 coupled with the hydrogen gas source 14 and the water removing receptacle 5, between the water removing receptacle 5 and the storage container 2, between the storage container 2 and the exhaust system 7, and between the valve V6 coupled with the storage container 2 and the exhaust system 7, are sufficiently exhausted via the mixer 8 and the exhaust pipe 16 to the outside for about one to five hours. That is, the abovesaid systems are made vacuous, by which they are cleaned. At the same time, the liquefying and gasifying receptacles $R_1$ and $R_2$ and the storage container 2 are cleaned by heating.

(1f) Next, the valve V8 and the operation of the exhaust system is stopped after which the valve V12 in the route between the storage container 2 and the mixer 8 is opened. Then the valve V10 couple with the hydrogen gas source 14 is opened to flow therefrom hydrogen ($H_2$) gas via a route (valve V10 - water removing receptacle 5 - valve 9 - check valve K2 - valve V4 - valve V5 - check valve K3 - valve V12 - mixer 8 - exhaust pipe 16) for about one to three hours. In the water removing receptacle 5 water is sufficiently removed from the hydrogen gas and, by the water-free hydrogen gas, the routes between the water removing receptacle 5 and the storage container 2 and between the storage container 2 and the mixer 8 are cleaned and at the same time, the storage containers 2 is cleaned by heating so that no unnecessary impurity containing water may remain in the container 2. In this case, the water removing receptacle 5 is held at 77° K. in the DEWAR'S vessel 6.

(1g) Next, the valve V4 is closed after closing the valves V5 and V12, by which the water-free hydrogen gas, which has been supplied from the water removing receptacle 5 to the side of the storage container 2, is supplied to a route (valve 3 - flowmeter F3 - liquefying and gasifying receptacle $R_2$ - valve V2 - flowmeter F2 - liquefying and gasifying receptacle $R_1$) via the flowmeter F5, the vale V9 and the check valve K2, filling the liquefying and gasifying receptacles $R_1$ and $R_2$ with the hydrogen gas.

Then, when the pressure by the hydrogen gas in the liquefying and gasifying receptacles $R_1$ and $R_2$ reaches about 1 atm, the valve V11 between the liquefying and gasifying receptacle $R_1$ and the mixer 8 is opened, flowing the water-free hydrogen gas from the water removing receptacle 5 to a route (valve V3 - flowmeter F3 - liquefying and gasifying receptacles $R_2$ - valve V2 - flowmeter F2-liquefying and gasifying receptacle $R_1$ - check valve K1 - valve V11 - flowmeter F6 - mixer 8 - exhaust pipe 16) via the flowmeter F5, the valve V9 and the check valve K2 for about one to five hours. In consequence, the route between the water removing receptacle 5 and the liquefying and gasifying receptacle $R_2$, the route between the liquefying and gasifying receptacles $R_1$ and $R_2$ and the route between the liquefying and gasifying receptacle $R_2$ and the mixer 8 are cleaned by the water-free hydrogen gas. At the same time, the liquefying and gasifying receptacles $R_1$ and $R_2$ are cleaned by heating so that no unnecessary impurity may remain therein.

In this case, it it preferable to open the valve V13 in the route between the hydrogen gas source 14 and the check valve 12 extending from the reactive gas cylinder 11 to flow the hydrogen gas from the hydrogen gas source 14 via a route (valve V13 - check valve K4 - check valve 12 - valve V1 - flowmeter F1 - check valve K1 - valve V11 - flowmeter F6 - mixer 8 - exhaust pipe 16), cleaning this route.

(1h) Next, the valve V1 in the route between the gas cylinder 11 and the liquefying and gasifying receptacle $R_1$ is closed, which is followed by closing the valve V11 between the liquefying and gasifying receptacle $R_1$ and the mixer 8, the valve V9 between the water removing receptacle 5 and the connection point of the valves V3 and V4, the valve V10 between the hydrogen gas source 14 and the water removing receptacle 5 and the valve V13 between the hydrogen gas source 14 and the check valve 12. Then the exhaust system 7 is actuated again and the valve V4 between the liquefying and gasifying receptacle $R_2$ and the storage container 2 and the valves V5 and V8 between the storage container 2 and the exhaust system 7 are opened. As a result of this, the liquefying and gasifying receptacles $R_1$ and $R_2$ and the storage container 2, including the routes between the valve V1 and the liquefying and gasifying receptacle $R_1$, between the liquefying and gasifying receptacles $R_1$ and $R_2$, between the liquefying and gasifying receptacles $R_1$ and $R_2$, between the valve V1 and the liquefying and gasifying receptacles $R_1$, between the liquefying and gasifying receptacle $R_2$ and the storage container 2, between the storage container 2 and the exhaust system 7 and between the valves V5 and V6, are exhausted or made vacuous, by which the abovesaid routes are cleaned. At the same time, the liquefying and gasifying receptacles $R_1$ and $R_2$ and the storage container 2 are cleaned by heating.

(1i) Next, the power supply from the controllers $C_1$, $C_2$ and 3 to the heaters $E_1$, $E_2$ and 4 is cut off, stopping the heating of the liquefying and gasifying receptacles $R_1$ and $R_2$ and the storage receptacles 2. Thus the cleaning treatment of the reactive gas refinery equipment 1 is completed.

Next, a description will be given of the above-described sequence of steps of liguefaction, gasification and storage of the reactive gas according to the present invention.

2. Liquefaction, Gasification and Storage of Reactive Gas (2a) Even after the above-described cleaning treatment of the reactive gas refinery equipment 1 the evacuation of the liquefying and gasifying receptacles $R_1$ and $R_2$ and the storage container 2 is still continued. This fact is checked by the compound gauges M1 and M2 attached to the liquefying and gasifying receptacles $R_1$ and $R_2$, respectively, and the compound gauge 19 associated with the storage container 2 via the valve V5 and the check valve 17.

Furthermore, in this case, the valve V2 between the liquefying and gasifying receptacles $R_1$ and $R_2$, the valves V3 and V4 between the liquefying and gasifying receptacle R and the storage container 2 and the valves V5 and V8 between the storage container 2 and the exhaust system 7 ought to remain open.

Moreover, the valve V1 between the gas cylinder 11 and the liquefying and gasifying receptacle $R_1$, the valve V6 between the storage container 2 and the gas outlet pipe 18, the valve V7 between the nitrogen gas source 15 and the mixer 8, the valve V9 between the water removing receptacle 5 and the storage container 2, the valve V10 between the hydrogen gas source 14 and the water removing receptacle 5, the valve V11 between the liquefying and gasifying receptacle $R_1$ and the mixer 8, the valve V12 between the storage container 2 and the mixer 8, and the valve V13 between the hydrogen gas source 14 and the check valve 12 of the gas cylinder 11 ought to remain closed. It is made sure that these valves are closed.

(2b) Next, the valve V2 between the liquefying and gasifying receptacles $R_1$ and $R_2$ is closed and then the DEWAR'S vessel $D_1$ having disposed therein the liquefying and gasifying receptacle $R_1$ is filled with liquid nitrogen to reduce the temperature of the receptacle $R_1$ low enough to liquefy the reactive gas $G_1$ loaded in the reactive gas cylinder 11. For example, when the reactive gas $G_1$ is silane ($SiH_4$), the temperature of the receptacle $R_1$ is held at $-150° \pm 10°$ C.

(2c) Next, the cock 11a of the reactive gas cylinder 11 is opened and the valve V1 is opened to supply the reactive gas $G_1$ to the liquefying and gasifying receptacle $R_1$ via the check valve 12, the valve V1 and the flowmeter F1 while observing the gas supply by the flowmeter F1. The reactive gas $G_1$ thus supplied to the liquefying and gasifying receptacle $R_1$ is converted therein into a liquefied reactive gas $G_1'$. At this time, the pressure of the receptacle $R_1$ can be held in the range from 0.5 to 5 atm.

(2d) Next, it is made sure by null reading of the flowmeter F1 that the reactive gas $G_1$ in the gas cylinder 11 has entirely been supplied to the liquefying and gasifying receptacle $R_1$. And it is made sure that the reactive gas $G_1$ has entirely been converted into the liquefied reactive gas $G_1'$. Thereafter the valve V1 is closed and then the cock 11a of the gas cylinder 11 is closed.

(2e) Next, the valve V3 between the liquefying and gasifying receptacle $R_2$ and the storage container is closed and the DEWAR'S VESSEL $D_2$ having disposed therein the liquefying and gasifying receptacle $R_2$ is filled with liquid nitrogen to reduce the temperature of the receptacle $R_2$ down to the same liquefying temperature as that of the receptacle $R_1$ mentioned above in (2b).

(2f) Next, the heater $E_1$ provided for the liquefying and gasifying receptacle $R_1$ is energized under the control of the controller $C_1$ to raise the temperature of the liquefying and gasifying receptacle $R_1$ high enough to gasify the liquefied reacitve gas $G_1'$. In the case where the reactive gas $G_1$ is silane ($SiH_4$) as mentioned previously, the gasifying temperature is selected in the range of $-90°$ to $-100°$ C.

In this way, the liquefied reactive gas $G_1'$ in the liquefying and gasifying receptacle $R_1$ is gasified into the reactive gas $G_2$ for 5 to 50 hours. At this time, the valve V2 between the receptacles $R_1$ and $R_2$ is opened to introduce the reactive gas $G_2$ via the flowmeter F2 and the valve V2 into the receptacle $R_2$, wherein it is converted into the liquefied reactive gas $G_2'$. In this case, the pressure of the receptacle $R_2$ can be set to 0.5 to 3 atm, and the flow rate of the reactive gas $G_2$ can be held in the range of 10 to 500 cc/min, preferably, 100 cc/min.

(2g) Next, it is made sure by reading of the flowmeter F2 that the liquefied reactive gas $G_1'$ in the liquefying and gasifying receptacle $R_1$ has entirely been gasified into the reactive gas $G_2$ and that the reactive gas $G_2$ has been introduced into the liquefying and gasifying receptacle $R_2$. Thereafter the valve V2 between the receptacles $R_1$ and $R_2$ is closed and the power supply to the heater $E_1$ is cut off.

(2h) Next, the valve V5 coupled with the storage container 2 is closed. At this time, it is made sure that the valve V6 coupled with the storage container 2 via the valve V5 and the valve 9 coupled with the water removing receptacle 5 is closed.

(2i) Next, the heater $E_2$ provided for the liquefying and gasifying receptacle $R_2$ is energized under the control of the controller $C_2$ to raise the temperature of the receptacle $R_2$ high enough to gasify the liquefied reactive gas $G_2'$. For example, when the reactive gas $G_1$ is silane as referred to above, the gasifying temperature is set to $-50°$ to $-70°$ C. In this way, the liquefied reactive gas $G_2'$ in the receptacle $R_2$ is gasified into the reactive gas $G_3$.

At this time, the valve V3 between the liquefying and gasifying receptacle $R_2$ and the storage container 2 is opened to introduce the reactive gas $G_3$ into the latter via the flowmeter F3 and the valves V3 and V4.

Thus the reactive gas $G_3$ is loaded into the storage container 2 until the pressure in the latter reaches 5 to 12 atm. Then, the valves V3 and V4 are closed and the power supply to the heater $E_2$ is cut off. Furthermore, the valve V8 is closed and the exhaust system 7 is stopped from operation. Thus the sequence of steps of liquefaction, gasification and storage of the reactive gas according to the present invention is completed.

The reactive gas $G_3$ packed into the storage container 2 is the reactive gas stored by the present invention. In the case of the embodiment shown in FIG. 1, the reactive gas $G_3$ stored in the storage container 2 is led out to the gas outlet pipe 18 via the valve V5, the check valve 17 and the valve V6. At this time, the heater 4 may be energized under the control of the controller 3 to raise the temperature of the storage container 2.

The reactive gas $G_3$ is obtained by liquefying and then gasifying the reactive gas $G_1$ from the gas cylinder 11 through using the liquefying and gasifying receptacle $R_1$ and by liquefying and then gasifying the gasified reactive gas $G_2$ through using the liquefying and gasifying receptacle $R_2$.

Since such a liquefaction-gasification step can be employed for the reactive gas $G_3$, the gas $G_3$ hardly contains an unnecessary impurity, or if contains, the quantity of such impurity is far smaller than that in the reactive gas $G_1$. The reason is in general, that when the reactive gas is liquefied and then gasified in the liquefying and gasifying receptacle, unnecessary impurities, such as, oxygen, carbon, silicon oxide, hydrocarbon, heavy metal and so forth, are left ungasified in the receptacle. By cleaning the refinery equipment prior to the liquefaction and gasification of the reactive gas according to the present invention, the reactive gas $G_3$ contains such unnecessary impurities in smaller quantity This is more marked especially when the cleaning treatment involves the steps of flowing hydrogen gas into the liquefying and gasifying receptacles and the step of evacuating them as described previously.

In FIG. 2, the curve 21 shows the concentrations (in $cm^{-3}$) of oxygen contained in a plurality of non-single-crystal semiconductor layer successively formed by the CVD method through the use of the reactive gas $G_3$ obtained by the above-described embodiment of the present invention. Ths curve 22 shows the concentrations of oxygen contained in a plurality semiconductor layers similarly formed through the use of a reactive gas obtained by merely passing the reactive gas $G_1$ through the liquefying and gasifying receptacles $R_1$ and $R_2$ without involving the liquefaction-gasification step after cleaning the reactive gas refinery equipment 1.

The curve 23 shows the concentrations of oxygen contained in a plurality of semiconductor layers similarly formed through the use of the reactive gas $G_1$ of the gas cylinder.

In FIG. 2, the abscissa represents the sample numbers of the pluralities of semiconductor layers successively formed. Shown in FIG. 2 are measured values in the case where the reactives gas $G_1$ was silane ($SiH_4$) and, accordingly, the semiconductor layers were formed of silicon. The curves 21 and 22 show measured values in the case where the liquefying and gasifying receptacles $R_1$ and $R_2$ were made of stainless steel and their interior surfaces were mirror-finished.

While in the foregoing the present invention has been described as being applied mainly to refining, as the reactive semiconductor material gas, silane ($SiH_4$) (having a molecular weight of 32.11, a boiling point of $-112°$ C., a specific gravity (AIRI) of 1.12, a gas density of 1.44 (g/l) and a liquid density of 0.711 (g/cc)), the invention is also applicable to refining germane ($GeH_4$) (having a molecular weight of 76.62, a boiling point of $-90°$ C., a specific gravity (AIRI) of 2.64, a gas density of 3.43 (g/l) and a liquid density of 1.523 (g/cc)) as the reactive semiconductor material gas. Also it is possible to apply the present invention to refining diborane ($B_2H_6$) (having a moulcular weight of 27.67, a boiling point of $-92.8°$ C., a specific gravity (AIRI) of 0.95, a gas density of 1.22 (g/l) and a liquid density of 0.470 (g/cc)), phosphine ($PH_3$) (having a molecular weight of 34.00, a boiling point of $-87.74°$ C., a specific gravity (AIRI) of 1.146, a gas density of 1.380 (g/l) and a liquid density of 0.746 (g/cc)) and arsine ($AsH_3$) (having a molecualr weight of 27.95, a boiling point of $-62.48°$ C., a specific gravity (AIRI) of 2.695, a gas density of 3.48 (g/l) and a liquid density of 1.604 (g/cc)) which are impurity material gases to be doped into semiconductor layers.

Moreover, the aforementioned liquifaction, gasificaion and storing of the reactive gas can also be carried out in the liquefying and gasifying receptacles $R_1$ and $R_2$ each provided with a fine powder adsorption filter.

Incidentally, it is possible with the refinery equipment of FIG. 1 to dilute the reactive gas $G_3$ in the storage container 2 by introducing thereinto the hydrogen gas from the hydrogen gas source 14 via the valve V10, the water removing receptacle 5, the flowmeter F5, the valve 9, the check valve K2 and the valve 4.

It will be apparent that many modifications and variations may be effected without departing from the scope of the novel concepts of the present invention.

What is claimed is:

1. A process for packing a reactive gas for use in the formation of a layer, said reactive gas having an oxygen concentration sufficiently small to preclude formation of oxygen clusters or oxides in the layer, the process by the steps of:
    (a) providing at least one storage storage container;
    (b) exhausting said storage container by exhaust means using a turbo-pump to purge it;
    (c) purifying the impure form of said reactive gas containing oxygen so taht the oxygen concentration is no more than $1 \times 10^{17}$ cm$^{-3}$; and
    (d) introducing the purified reactive gas into said purged container for storage therein for use in the formation of the layer.

2. The process according to claim 1, wherein said reactive gas is obtained by introducing an impure reactive gas containing at least oxygen in an amount sufficient to interfere with formation of the layer into a liquifying and gasifying receptacle wherein said impure reactive gas is liquefied to form a liquefied reactive gas and then said liquefied reactive gas is gasified to form a gasified reactive gas.

3. The process according to claim 1 or 2, wherein the step (b) includes heating of said storage container.

4. The process according to any one of claims 1 to 2 further comprising the step (b)', intermediate between the steps (b) and (c), of purging said storage container with hydrogen.

5. The process according to any one of claims 1 to 4, wherein said reactive gas contains oxygen no more than 1 ppm.

6. The process according to any one of claims 1 to 4, wherein said reactive gas is a reactive semiconductor material gas.

7. The process according to claim 6, wherein said reactive semiconductor material consists principally of silane or germane.

8. The process according to any one of claims 1 to 4, wherein said reactive gas is a reactive impurity material gas.

9. The process according to claim 8, wherein said reactive impurity material gas is diboxane, phosphine or arsine.

10. A process as in claim 13 where said purifying step includes the steps of:
    (a) providing at least one liquefying and gasifying receptacle; and
    (b) introducing impure forms of the reactive gas into the said receptacle and liquefying said impure reaction gas therein to form a liquefied reactive gas, and then gasefying said liquefied reactive gas in said receptacle to form said purified reactive gas.

11. The process according to claim 10 further comprising the step (a)', intermediate step (a) and (b), of purging said receptable and said storage container with hydrogen.

12. The process according to claim 11, wherein the step (a)', further comprising simultaneously heating said receptable and said storage container.

* * * * *

UNITED STATES PATENT AND TRADEMARK OFFICE
CERTIFICATE OF CORRECTION

PATENT NO. : 4,623,369

DATED : November 18, 1986

INVENTOR(S) : Shunpei YAMAZAKI

It is certified that error appears in the above-identified patent and that said Letters Patent is hereby corrected as shown below:

On the title page and col. 1, lines 1-2:
[54] PROCESS FOR PACKING A REACTIVE GAS FOR
    FORMING SEMICONDUCTOR LAYER Column 9, line 30, change "storage storage" to --storage--.
Column 10, line 1, change "liquifying" to --liquefying--.
Column 10, line 26, change "13" to --1--.
Column 10, line 33, change "gasefying" to --gasifying.

Signed and Sealed this

First Day of December, 1992

Attest:

DOUGLAS B. COMER

Attesting Officer  Acting Commissioner of Patents and Trademarks

UNITED STATES PATENT AND TRADEMARK OFFICE
CERTIFICATE OF CORRECTION

PATENT NO. : 4,623,369
DATED : November 18, 1986
INVENTOR(S) : Shunpei YAMAZAKI

It is certified that error appears in the above-identified patent and that said Letters Patent is hereby corrected as shown below:

Column 9, line 30, delete "storage" (first occurrence).

Signed and Sealed this

Sixteenth Day of August, 1994

Attest:

BRUCE LEHMAN

*Attesting Officer*     *Commissioner of Patents and Trademarks*